US006820401B2

(12) United States Patent  
Behnke

(10) Patent No.: US 6,820,401 B2
(45) Date of Patent: Nov. 23, 2004

(54) METHOD AND APPARATUS FOR TENSIONING COVER TAPE

(75) Inventor: Merlin E. Behnke, Grafton, WI (US)

(73) Assignee: International Product Technology, Inc., New Berlin, WI (US)

( * ) Notice: Subject to any disclaimer, the term of this patent is extended or adjusted under 35 U.S.C. 154(b) by 159 days.

(21) Appl. No.: 10/282,625

(22) Filed: Oct. 29, 2002

(65) Prior Publication Data

US 2003/0079446 A1 May 1, 2003

Related U.S. Application Data

(60) Provisional application No. 60/335,505, filed on Oct. 31, 2001.

(51) Int. Cl.[7] .............................. B65B 7/28; B67B 1/00; B67B 3/00
(52) U.S. Cl. .............................. 53/486; 53/478; 53/487; 53/282; 53/289; 53/290
(58) Field of Search .......................... 53/477, 478, 487, 53/281, 282, 289, 290, 296, 300, 329.2, 329, 329.3, 329.4, 486; 156/487

(56) References Cited

U.S. PATENT DOCUMENTS

| 3,116,580 | A | * | 1/1964 | Anderson ..................... 53/329 |
| 3,780,493 | A | * | 12/1973 | Baker .......................... 53/287 |
| 4,969,306 | A | * | 11/1990 | Wallin ......................... 53/329 |
| 5,597,428 | A | * | 1/1997 | Matsumoto et al. .......... 53/478 |
| 5,729,963 | A | | 3/1998 | Bird |
| 5,846,621 | A | * | 12/1998 | Nagamatsu ................ 428/40.1 |
| 6,250,051 | B1 | * | 6/2001 | Mori et al. ................... 53/453 |
| 6,404,181 | B1 | * | 6/2002 | Hikita ........................ 206/714 |
| 6,425,484 | B1 | * | 7/2002 | Sakurai ...................... 206/714 |

FOREIGN PATENT DOCUMENTS

WO          WO 99/03733          * 1/1999

* cited by examiner

Primary Examiner—Louis Huynh
(74) Attorney, Agent, or Firm—Michael Best & Friedrich LLP

(57) ABSTRACT

A method and apparatus for packaging parts in compartments of a carrier tape and affixing a cover tape over the carrier tape to trap the parts in the compartments. The method and apparatus provide for deflecting a flange of the carrier tape and sealing the cover tape to the deflected flange. The cover tape is tightened across the carrier tape when the carrier tape flange returns to its undeflected condition.

25 Claims, 3 Drawing Sheets

METHOD AND APPARATUS FOR TENSIONING COVER TAPE

RELATED APPLICATION

This application claims the benefit of U.S. Provisional Application No. 60/335,505, filed Oct. 31, 2001.

FIELD OF THE INVENTION

This invention relates to an apparatus for packaging parts, which may be, for example, microprocessors, computer chips, circuit boards, or any other electrical or mechanical components, in the compartments of a carrier tape, and affixing a cover tape over the carrier tape to trap the parts in the compartments. More specifically, the invention relates to a method for pulling tight or tensioning the cover tape after it has been sealed to the carrier tape.

BACKGROUND OF THE INVENTION

Small parts, such as microprocessors, computer chips, circuit boards, or any other electrical or mechanical components are often packaged in carrier tape holding compartments. These compartments are then sealed with cover tape to ensure that the parts will not fall out of the compartments. During the cover tape sealing process, the cover tape may buckle or bow, which compromises the peel strength of the cover tape. Additionally, ripples or creases in the cover tape caused by such buckling or bowing may be mistaken during post-seal inspection as a "sealing perimeter" or "part" defect, which can result in a rejection of a good part due to poor packaging.

SUMMARY OF THE INVENTION

The invention provides a method for attaching cover tape to carrier tape having side flanges and compartments between the side flanges. The method includes bending at least one of the side flanges of the carrier tape upward as the cover tape is bonded to both side flanges, and then releasing the bent flange once the cover tape is bonded to the flanges. The released flange returns to a flat orientation, which creates a tension in the cover tape, and ensures a tight fit of the cover tape over the compartments of the carrier tape.

Figure 1:
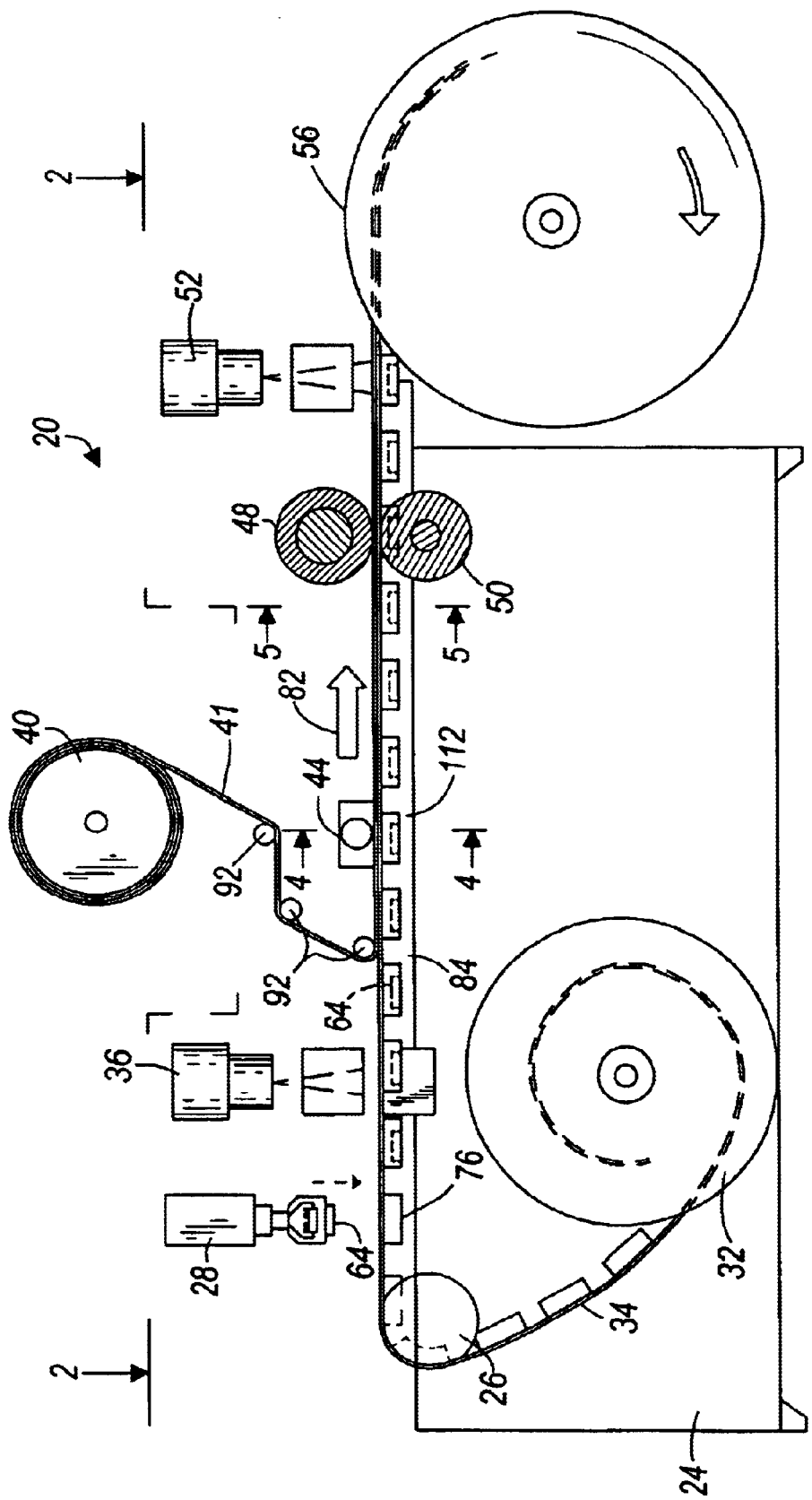
FIG. 1 is a side view of an inspection, handling, and packaging apparatus of the type with which this invention is usable.

Before one embodiment of the invention is explained in detail, it is to be understood that the invention is not limited in its application to the details of construction and the arrangement of components or steps set forth in the following description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

Figure 2:
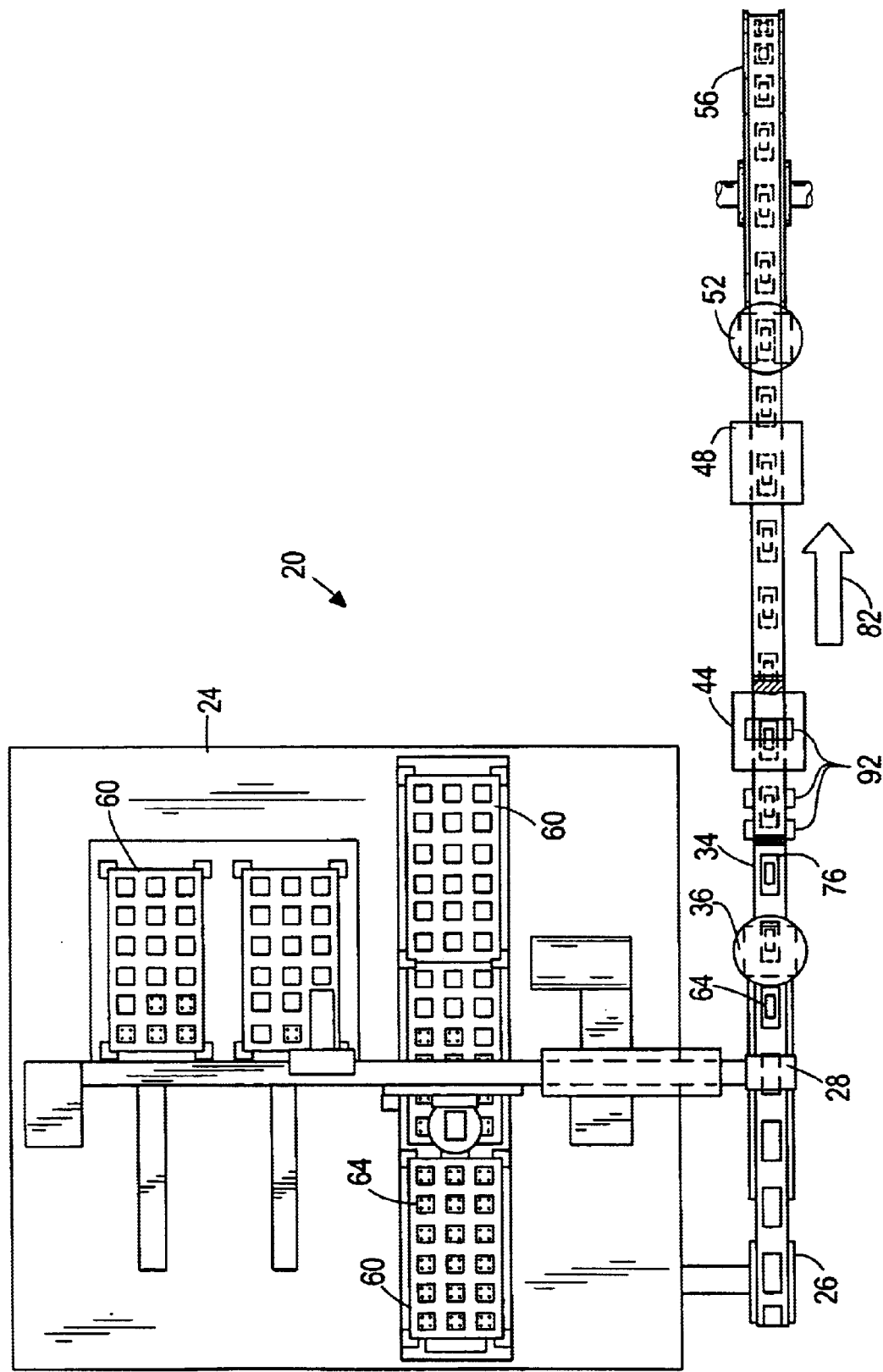
FIG. 2 is a top view of the inspection, handling, and packaging apparatus of FIG. 1 along line 2—2.

FIGS. 1 and 2 illustrate an inspection, handling, and packaging apparatus 20 that includes a support stand 24, an infeed carrier tape drive wheel 26, a pick-and-place head or transport 28, a carrier tape infeed reel 32 dispensing carrier tape 34, a camera-over-tape or "COT" inspection module 36, a cover tape reel 40 dispensing cover tape 41, a sealing shoe 44, a resilient drive roller 48, a backup wheel 50, a camera-after-sealing inspection module or "CASI" module 52, and an output reel packaging module 56.

The support stand 24 supports a plurality of part input trays 60 that contain parts 64 to be inspected and packaged. The parts 64 may be, for example, microprocessors, computer chips, circuit boards, or any other electrical or mechanical components. The transport 28 picks the parts 64 off the input trays 60, and transfers the parts 64 to the carrier tape 34. The transport 28 is preferably a pick-and-place type transport utilizing a vacuum head.

Figure 3:
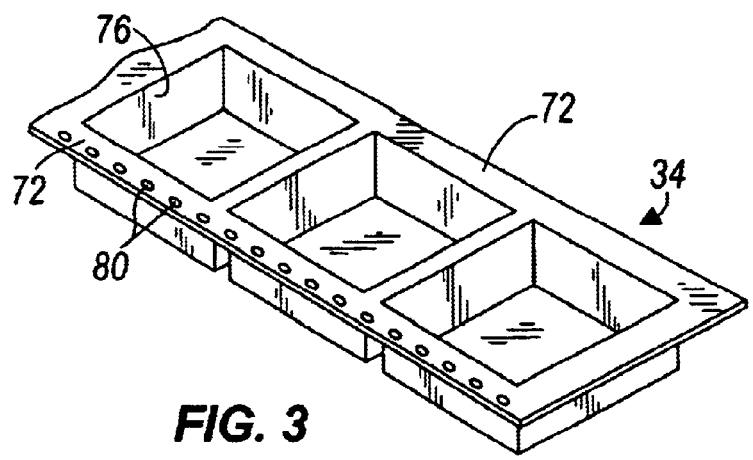
FIG. 3 is a perspective view of a portion of a carrier tape.

The carrier tape 34 is best illustrated in FIG. 3, and includes a pair of flanges 72 running along its length, and compartments 76 formed between the flanges 72. One or both of the flanges 72 may include sprocket holes 80 to facilitate advancing the carrier tape 34 through the apparatus 20 and/or other machinery. For example, the infeed carrier tape drive wheel 26 may be a pinwheel having sprocket pins that engage the sprocket holes 80 of the carrier tape 34. The drive wheel 26 may be driven under power by a motor (not illustrated) to pull the carrier tape 34 off the infeed reel 32. Alternatively, the drive wheel 26 may have a smooth or flat surface and/or be passive or not driven by a motor.

The resilient drive roller 48 rotates under the power of a motor (not illustrated) to pull the carrier tape 34 through the apparatus 20 in a downstream direction 82 (an upstream direction being opposite the downstream direction 82). The flanges 72 of the carrier tape 34 are pinched between the drive roller 48 and the backup wheel 50 to facilitate the advancement of the carrier tape 34 under the influence of the rotating drive roller 48. Alternatively, the drive roller 48 may include pins that engage the sprocket holes 80 in the tape flanges 72 to facilitate advancing the carrier tape 34 through the apparatus 20. The carrier tape 34 is supported at its flanges 72 by guide rails 84 (FIGS. 1, 4, and 5) that extend substantially the entire length of the apparatus 20.

Referring again to FIGS. 1 and 2, the transport 28 places a single part 64 into each compartment 76 of the carrier tape 34. The COT inspection module 36 is downstream of the transport 28, and includes a camera, which inspects the parts 64 in the carrier tape compartments 76 as the carrier tape 34 is advanced through the apparatus 20.

The cover tape 41 is laid on top of the carrier tape 34 downstream of the COT inspection module 36, and is pulled through the apparatus 20 along with the carrier tape 34. The cover tape 41 is guided from the cover tape reel 40 to the carrier tape 34 by a plurality of tensioning rollers 92. The cover tape 41 extends between the flanges 72 and completely covers the compartments 76. The adhesive, which is on the cover tape 41 surface, faces the carrier tape 34. Heat activated cover tape has adhesive across the complete cover tape surface. Pressure sensitive activated cover tape has only two strips of adhesive that are located over the flanges 72 of the carrier tape 34. The adhesive is used to seal the cover tape 41 to the flanges 72 of the carrier tape 34.

Figure 4:
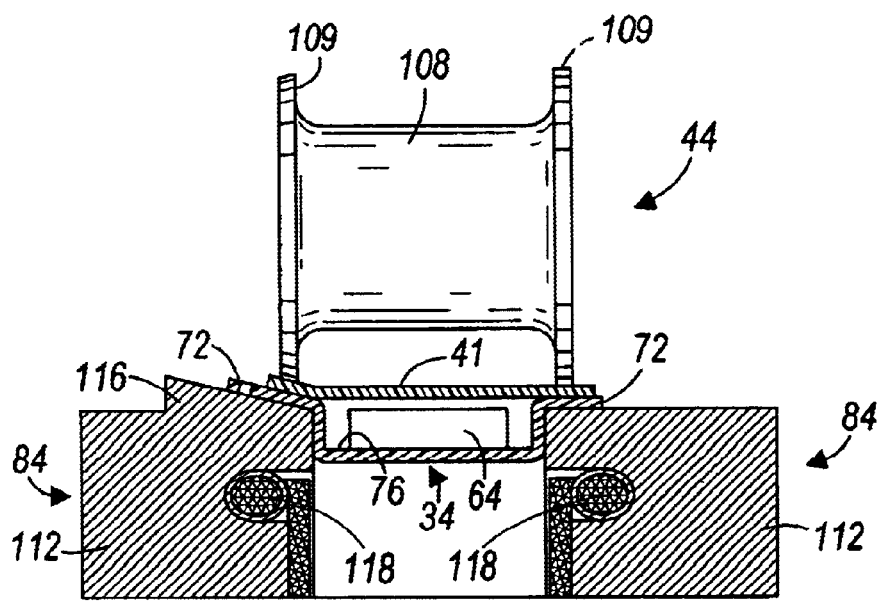
FIG. 4 is a section view, along line 4—4 in FIG. 1.

Referring now to FIGS. 1, 2, and 4, the sealing shoe 44 is downstream 82 of the last tension roller 92. The sealing shoe 44 includes a sealing mechanism 108 that is either a spool-shaped wheel or longitudinal flat shoe. The sealing mechanism 108 has flanges or edges 109 aligned over the flanges 72 of the carrier tape 34, and in alignment with the lines of adhesive on the cover tape 41 if pressure sensitive adhesive is used. The wheel of the sealing mechanism 108 may be rotated under power or may passively roll as the tape 34, 41 passes under it.

A downward force is applied to the sealing mechanism 108 to pinch the cover tape 41 and carrier tape 34 together between the sealing flanges 109 and the guide rails 84. The portion 112 of at least one of the guide rails 84 under the shoe 44 includes an angled surface or a ramp 116 for the associated flange 72 to ride up. Although one guide rail 84 is ramped in the illustrated construction, both guide rails 84 can be tapered toward the sealing mechanism 108 and still be within the scope of the invention. The flange 72 and cover tape 41 are therefore bent or angled up toward the shoe 44 as the bonding process occurs. The edge of the flange 109 over the ramp 116 is angled to complement the angle of the ramp 116 and to facilitate bonding. If heat is required to activate the adhesive, heating elements 118 (FIG. 4) may be inserted into the portions 112 of the guide rails 84 under the sealing shoe 44 for that purpose.

Figure 5:
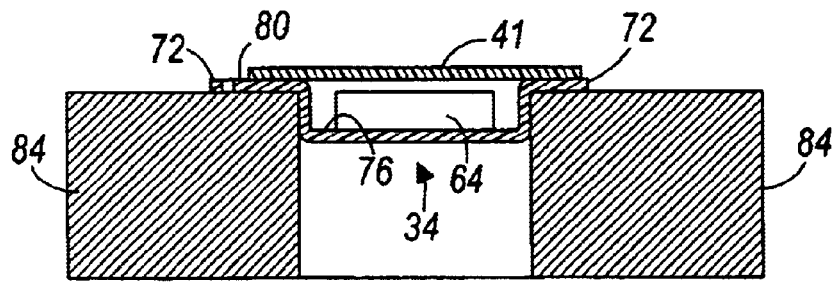
FIG. 5 is a section view, along line 5—5 in FIG. 1.

With reference to FIG. 5, the guide rails 84 are substantially flat downstream 82 of the sealing shoe 44. The carrier tape 34 is sufficiently resilient to be bent up under the shoe, and spring back to the flat condition illustrated in FIG. 5. As the carrier tape 34 springs back to this flat condition, the cover tape 41 is pulled tight across the compartments 76, and assumes a substantially flat, planar orientation. In this flat, planar orientation, there is some tension in the cover tape 41 which causes any wrinkles in the cover tape 41 to be flattened out.

Referring back to FIGS. 1 and 2, the CASI module 52 is downstream 82 of the sealing shoe 44 and includes a camera that looks down at the tape 34, 41 and inspects the sealing bonding process for possible sealing shoe position errors or inconsistent sealing perimeters. Flattening the cover tape 41 as described above helps to reduce false rejections by the CASI module 52. Such false rejections may be caused by the camera of the CASI module 52 mistaking wrinkles in the cover tape 41 as flaws. Also, the tightness of the cover tape 41 on the carrier tape 34 reduces the pull strength values that are tested on Peel Strength Analyzers with customers' tape-and-reel processes.

The loaded carrier tape 34 is then wound onto the output reel-packaging module 56. The apparatus 20 also includes a processor (not illustrated) that receives information from the COT and CASI modules 36, 52. The processor has memory that records which of the parts 64 have been indicated by the inspection modules 36, 52 as having flaws. The flawed tape sealing process or bad parts in tape are later reviewed and, within another operational processes, the good parts 64 are taken from the carrier tape 34 for their end use.

What is claimed is:

1. A part packaging apparatus for packaging parts in a carrier tape having serially spaced-apart compartments and at least one resilient flange extending alongside the compartments and having an at-rest condition, and for applying a cover tape over the carrier tape, the apparatus comprising:
    a part placement head adapted to position parts in the carrier tape compartments;
    a cover tape applicator for laying the cover tape over the carrier tape such that the cover tape defines a cover tape plane;
    a sealing apparatus operable to seal the cover tape to the carrier tape flange and trap the part in the compartment; and
    a deflecting member supporting the flange and deflecting the flange and the portion of the cover tape over the flange away from the at-rest condition and at a non-zero angle with respect to the plane while the sealing apparatus seals the cover tape to the carrier tape flange;
    wherein the carrier tape flange resiliently returns to its at-rest condition after sealing to thereby tighten the cover tape across the carrier tape compartments.

2. The apparatus of claim 1, wherein the sealing apparatus includes a sealing wheel having at least one wheel flange that applies pressure on the cover tape to seal the cover tape to the carrier tape along a sealing line.

3. The apparatus of claim 2, wherein the deflecting member defines a plane of deflection and the wheel flange includes an edge that is generally parallel to the plane of deflection at the point of contact with the cover tape.

4. The apparatus of claim 1, further comprising a guide rail under the carrier tape flange and having a top surface supporting the carrier tape, wherein the deflecting member is defined by a ramped section of the guide rail under the sealing apparatus.

5. The apparatus of claim 4, wherein the top surface of the guide rail is generally parallel to the cover tape plane on either side of the ramped section and defines the plane of deflection in the ramped section.

6. The apparatus of claim 1, wherein the sealing apparatus includes first and second sealing members for sealing the cover tape to the carrier tape on opposite sides of the carrier tape compartments.

7. The apparatus of claim 1, wherein the cover tape is transparent, the apparatus further comprising an inspection module to inspect the part in the compartment through the cover tape after sealing.

8. A method of sealing parts in a carrier tape having serially spaced-apart compartments and at least one flange extending alongside the compartments, the method comprising:
    positioning parts in the carrier tape compartments;
    applying cover tape over the carrier tape, the cover tape defining a plane;
    deflecting the carrier tape flange to a non-parallel plane of deflection with respect to the plane defined by the cover tape;
    sealing the cover tape to the so-deflected flange;
    returning the flange to a plane parallel with the plane defined by the cover tape; and
    tightening the cover tape across the carrier tape in response to the return of the flange to the plane parallel with the plane defined by the cover tape.

9. The method of claim 8, further comprising guiding the carrier tape flange on a guide rail having a ramped portion wherein deflecting the carrier tape flange includes moving the carrier tape flange onto the ramped portion, and returning the flange includes moving the carrier tape flange off the ramped portion.

10. The method of claim 8, wherein sealing the cover tape to the so-deflected flange includes applying at least one of heat and pressure to adhesive on the cover tape.

11. The method of claim 8, further comprising supporting the carrier tape flange with a top surface of a guide rail, the top surface being generally parallel to the cover tape plane.

12. The method of claim 11, wherein deflecting includes ramping the guide rail such that the top surface is generally parallel to the plane of deflection.

13. The method of claim 12, wherein returning includes returning the top surface of the guide rail to being generally parallel to the cover tape plane downstream of the ramped portion.

14. The method of claim 8, wherein the cover tape is transparent, and further comprising inspecting the part through the cover tape with an inspection module after the cover tape is sealed to the carrier tape.

15. The method of claim 8, wherein the carrier tape flange is a resilient member and wherein returning the flange includes permitting the flange to return to the plane parallel with the plane defined by the cover tape under the influence of the resiliency of the flange.

16. The method of claim 8, further comprising sealing the cover tape to the carrier tape on opposite sides of the compartments.

17. A part packaging apparatus for packaging parts in a carrier tape having serially spaced-apart compartments and two flanges extending on opposite sides of the compartments, and for applying a cover tape over the carrier tape, the apparatus comprising:

a part placement head adapted to position parts in the carrier tape compartments;

an inspection module to inspect the part in the carrier tape compartment;

a cover tape applicator for laying the cover tape over the carrier tape such that the cover tape defines a plane;

a sealing apparatus to seal the cover tape to the carrier tape on either side of the compartments and thereby trap the parts in the compartments;

a guide rail supporting the carrier tape flange, the rail having a ramped portion under the sealing apparatus, wherein the ramped portion deflects at least one flange of the carrier tape with respect to the plane defined by the cover tape during sealing; and an after-seal inspection module to inspect the part through the cover tape after sealing.

18. The apparatus of claim 17, wherein the sealing apparatus includes a sealing wheel having first and second edges that apply pressure on the cover tape to seal the cover tape to the respective flanges of the carrier tape.

19. The apparatus of claim 18, wherein the ramped portion defines a plane of deflection and the sealing wheel edges are in a plane parallel with respect to the plane of deflection when in contact with the cover tape.

20. The apparatus of claim 17, wherein the carrier tape is constructed of a resilient material such that the deflected flange is permitted to return to the plane parallel with the plane defined by the cover tape.

21. The apparatus of claim 17, wherein the sealing apparatus includes a sealing wheel having an edge that is in a plane parallel with the plane defined by the cover tape, and wherein the cover tape is sealed to the flange.

22. A method of securing a part in a carrier tape having serially spaced-apart compartments and first and second flanges extending on opposite sides of the compartments, the method comprising:

positioning parts in the carrier tape compartments;

inspecting the part with an inspection module after the part is positioned in the carrier tape compartment;

applying cover tape over the carrier tape, the cover tape defining a plane;

guiding the flanges on a guide rail having a ramped portion;

deflecting the first flange of the carrier tape to a non-parallel plane with respect to the plane defined by the cover tape by moving the first flange over the ramped portion, the second flange remaining in a non-deflected position;

sealing the cover tape to the first and second flanges while the first flange is deflected;

returning the first flange to a plane parallel with the plane defined by the cover tape;

tightening the cover tape across the carrier tape in response to the return of the first flange to the plane parallel with the plane defined by the cover tape; and inspecting the part in its compartment through the cover tape with an inspection module after tightening the cover tape.

23. The method of claim 22, wherein sealing the cover tape to the first and second flanges includes applying heat to the flanges to activate adhesive on the cover tape.

24. The method of claim 22, wherein the first flange is a resilient member and wherein returning the flange includes permitting it to return to the plane parallel with the plane defined by the cover tape under the influence of its resiliency.

25. The method of claim 22, wherein tightening the cover tape includes removing wrinkles from the cover tape.

* * * * *